(12) United States Patent
Driemel

(10) Patent No.: US 7,826,887 B2
(45) Date of Patent: Nov. 2, 2010

(54) MR HEAD COIL

(75) Inventor: Daniel Driemel, Oderan (DE)

(73) Assignee: Siemens Aktiengesellschaft, Munich (DE)

( * ) Notice: Subject to any disclaimer, the term of this patent is extended or adjusted under 35 U.S.C. 154(b) by 302 days.

(21) Appl. No.: 11/877,862

(22) Filed: Oct. 24, 2007

(65) Prior Publication Data

US 2008/0097192 A1  Apr. 24, 2008

(30) Foreign Application Priority Data

Oct. 24, 2006  (DE) .................. 10 2006 050 104

(51) Int. Cl.
*A61B 5/05* (2006.01)
*G01V 3/00* (2006.01)
(52) U.S. Cl. ...................... 600/422; 324/322
(58) Field of Classification Search ......... 600/407–410, 600/421, 422; 324/318–322
See application file for complete search history.

(56) References Cited

U.S. PATENT DOCUMENTS

| 5,177,443 | A | * | 1/1993 | Gilderdale | 324/318 |
| 5,945,827 | A | * | 8/1999 | Gronauer et al. | 324/318 |
| 7,345,483 | B2 | * | 3/2008 | Vaughan | 324/318 |
| 7,375,527 | B2 | * | 5/2008 | Vaughan, Jr. | 324/318 |
| 7,619,413 | B2 | * | 11/2009 | Wiggins et al. | 324/318 |
| 2002/0198450 | A1 | * | 12/2002 | Reykowski | 600/422 |
| 2003/0016017 | A1 | * | 1/2003 | Reykowski et al. | 324/322 |
| 2005/0107686 | A1 | * | 5/2005 | Chan et al. | 600/422 |
| 2007/0066885 | A1 | * | 3/2007 | Vaughan | 600/411 |
| 2007/0085543 | A1 | * | 4/2007 | Vaughan | 324/318 |
| 2007/0132454 | A1 | * | 6/2007 | Vaughan | 324/318 |
| 2007/0270683 | A1 | * | 11/2007 | Meloy | 600/415 |
| 2008/0024133 | A1 | * | 1/2008 | Vaughan et al. | 324/318 |
| 2009/0179643 | A1 | * | 7/2009 | Lin | 324/312 |

* cited by examiner

*Primary Examiner*—Eric F Winakur
*Assistant Examiner*—Sanjay Cattungal
(74) *Attorney, Agent, or Firm*—Schiff Hardin LLP

(57) ABSTRACT

An MR head coil has a helmet-shaped coil housing and an arrangement of a number of first antenna elements mounted on the coil housing. The helmet-shaped coil housing is shaped such that it completely frees the field of view of a patient, and second antenna elements or antenna element parts that can be temporarily arranged in the field of view are provided.

3 Claims, 4 Drawing Sheets

MR HEAD COIL

BACKGROUND OF THE INVENTION

1. Field of the Invention

The present invention concerns a magnetic resonance (MR) head coil suitable for use in examinations of the head of a patient in magnetic resonance tomography. Head coils of the above type are in particular used in fMRI (functional magnetic resonance imaging) methods.

2. Description of the Prior Art

An MR head coil having a helmet-shaped coil housing with an arrangement of a number of antenna elements being mounted on the coil housing, and wherein the coil housing is shaped so as to completely free the field of view of a patient wearing the coil housing, is known from EP 0 148 566 A1.

For magnetic resonance examinations of the head of a patient in a magnetic resonance tomography, it is desirable to place antenna elements that serve for excitation and/or readout of magnetic resonance signals optimally densely on the head surface. An antenna element carrier in the form of a helmet closely abutting the head is frequently used for this purpose, on which are arranged antenna elements such that they ensure a complete head imaging. For this purpose it is required that antenna elements are also placed in the field of view of the patient.

FIG. 5 shows a helmet-shaped coil housing with antenna elements according to the prior art. In the following the combination made up of coil housing and antenna elements is called a head coil. The head coil 1 shown in FIG. 5a has a uniformly distributed arrangement of a number of first antenna elements 2 that are arranged on or in a coil housing 3. In order to be able to also generate and/or read out magnetic resonance signals in the field of view of the head of the patient 4, the helmet-shaped coil housing 3 is pulled down below the eyes of the patient in the field of view, with two coil elements arranged like eyeglasses. Gaps 5 through which the patient can look are provided inside the antenna elements 2 in the coil housing 3 in the field of view of the patient 4.

In a perspective, schematic view, FIG. 5b shows the helmet-shaped coil body placed on a patient head.

The gaps 5 significantly impede the view of the patient. In order to prevent or mitigate claustrophobic feelings of the patient, eyeglasses with a mirror tilted by 45° are often placed on the patient so that, while situated in the scanner tube, the patient can look out from the tube. The attachment of such eyeglasses is hindered or made entirely impossible with the head coils shown in FIGS. 5a and 5b.

A free view is particularly important for the patient in functional imaging (fMRI). Among other things, films, images or a text for stimulation are shown to the patient, and any limitation of the field of view hinders the patient's intake of information and influences the result. The problem of the viewing obstruction is aggravated the more (and consequently smaller) antenna elements that are placed on the coil housing 3 around the head. This is particularly relevant since an emerging development is the use of head coils with low channel numbers, i.e. a lower number of antenna elements (for instance 1 to 4), up to head coils with 12 antenna elements and even up to 32-channel head coils, i.e. those with 32 antenna elements. Due to the larger number of the antenna elements the individual elements are inevitably smaller and it is thus nearly impossible to offer the patient a free field of view in the manner shown in FIGS. 5a and 5b. For 12-channel head coils it helps that the antenna elements in the viewing region of the patient were enlarged in diameter relative to the remaining antenna elements, such that the gaps 5 could be made correspondingly larger. The different size of the antenna elements, however, can lead to signal inhomogeneities in the head and performance degradation.

Due to the small antenna element size, the future multi-channel coils (for example head coils with 32 antenna elements and more) have in the viewing region a plurality of elements that can also overlap. These viewing elements are not necessary for functional imaging (in which, as already mentioned, an unoccluded view of the patient from the coil is necessary) and can therefore be removed.

EP 0 148 566 A1 describes an MR head coil in the form of a helmet that frees the field of view. Mounting of additional coils or control elements is not provided.

Similar head coils are also known from WO 2005/109010 A2 and DE 195 05 062 A1. Magnetic field inhomogeneities due to the missing coils in the field of view are accepted.

EP 0 437 049 A2 describes a coil arrangement for eye examination of patients. The MR coils are either a type of contact lens that is inserted into the eye or mounted on an eyeglasses frame. Here exclusively an eye examination is intended.

SUMMARY OF THE INVENTION

An object of the present invention is to provide a head coil of the general type described above wherein, in specific cases, unnecessary antenna elements that hinder the free view of the patient out from the head coil can not only be electrically deactivated but also can be mechanically removed or moved away from the field of view.

The above object is achieved in accordance with the present invention by a magnetic resonance (MR) head coil having a helmet-shaped coil housing and an arrangement of a number of first antenna elements fixedly mounted on the coil housing, the helmet-shaped coil housing having a configuration that completely frees the field of view of a patient wearing the coil housing, and wherein the head coil has second antenna elements, or antenna element parts, that can be temporarily arranged in the patient's field of view, that are electrically connectible with the first antenna elements, or antenna element parts thereof, that are arranged on the coil housing.

The present invention is based on antenna elements arranged in the field of view of the patient not being permanently integrated into the remaining coil housing but rather being arranged mechanically separate from the housing and can, for example, be affixed on the coil housing, folded away on the coil housing, or inserted into the coil housing. In an embodiment of the invention, the antenna elements for the field of view are completely separate from the coil housing and are carried on a carrier housing in the form of eyeglasses that are placed on the patient. Such "antenna element eyeglasses" can possibly also be used as a separate eye coil.

DESCRIPTION OF THE PREFERRED EMBODIMENTS

Figure 1A:
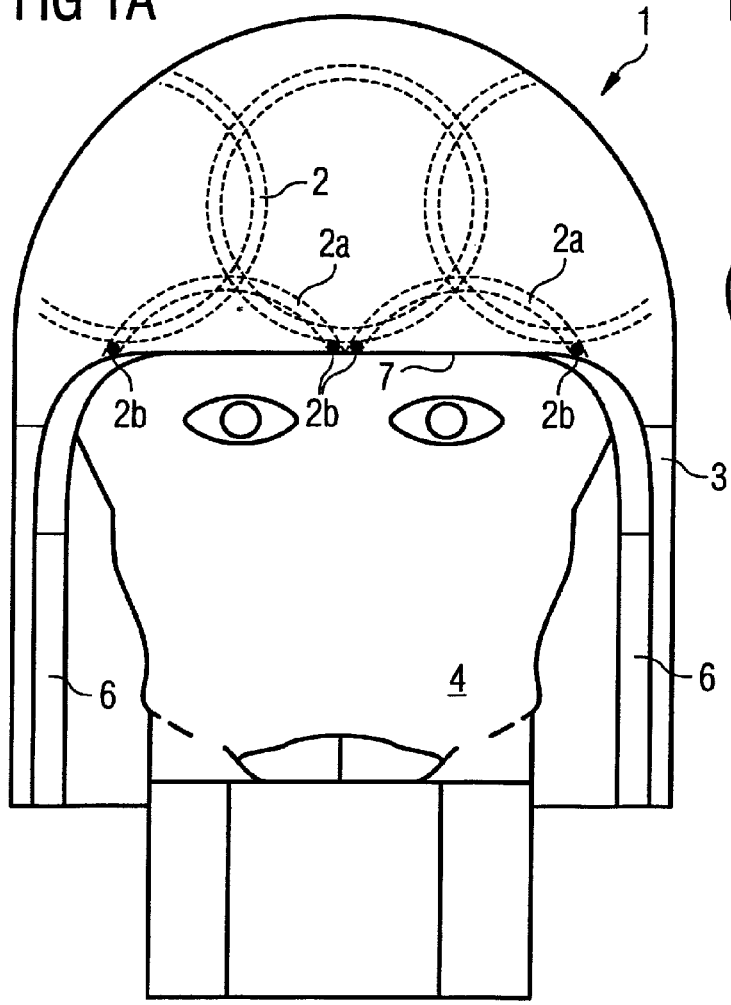
FIGS. 1a and 1b illustrate a first embodiment of the present invention.
Figure 1B:
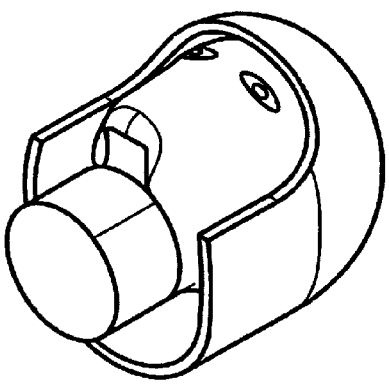

FIG. 1 shows a first embodiment of an inventive head coil 1 with first antenna elements 2 that are arranged uniformly and partially overlapping on the coil housing 3. The coil housing 3 is helmet-shaped and leaves the view of the patient 4 open up to a point above his eyes. At approximately the level of the maxillary bones of the patient face, the opening for the face of the helmet-shaped coil housing is bordered by two sides 6 drawn down to approximately the throat of the patient. The rear region of the head is closely enclosed by the coil housing 1 at the level of the sides and likewise has antenna elements 2. The viewing opening in the helmet-shaped coil housing 3 exhibits an upper edge 7 that runs essentially in a straight line, for instance at the level of the eyebrows of the patient 4. Antenna element parts 2a that here have the shape of circle segments and whose ends 2b end at the upper edge 7 of the viewing opening of the coil housing 3 are arranged in the coil housing 3. Electrical plug connectors (male connectors or socket plugs) are arranged there at which the corresponding mating plugs of second antenna element parts (see FIG. 2) can be inserted.

Figure 2:
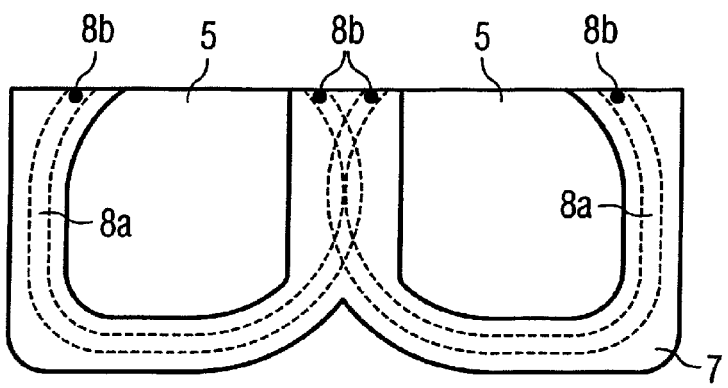
FIG. 2 shows a separate, attachable antenna element part for the head coil according to FIGS. 1a, 1b.

FIG. 2 shows a separate pluggable head coil part which can be plugged into the head coil housing 3 according to the first embodiment of the invention. Second antenna element parts 8a are arranged on the housing carrier 7. The antenna element parts 8a (of which two are provided that respectively significantly cover the region of one eye) essentially have the shape of circle segments, such that they respectively form a circle with the antenna element parts 2a after connecting together the plugs 2b and the mating plugs 8b that [sic] at the free ends of the circle segment-shaped antenna element parts 8a. The housing carrier 7 exhibits gaps 5 so that the pluggable head coil part is arranged like an eyeglasses frame with regard to the patient body and the view from the helmet-shaped coil housing is enabled for said patient. As already mentioned, this pluggable head coil part can be removed via detachment of the plug connectors 2b, 8b when no complete head imaging is required (as is the case, for example, for fMRI methods), and thus the patient 4 has a free view out from a large, free field of view.

Figure 3:
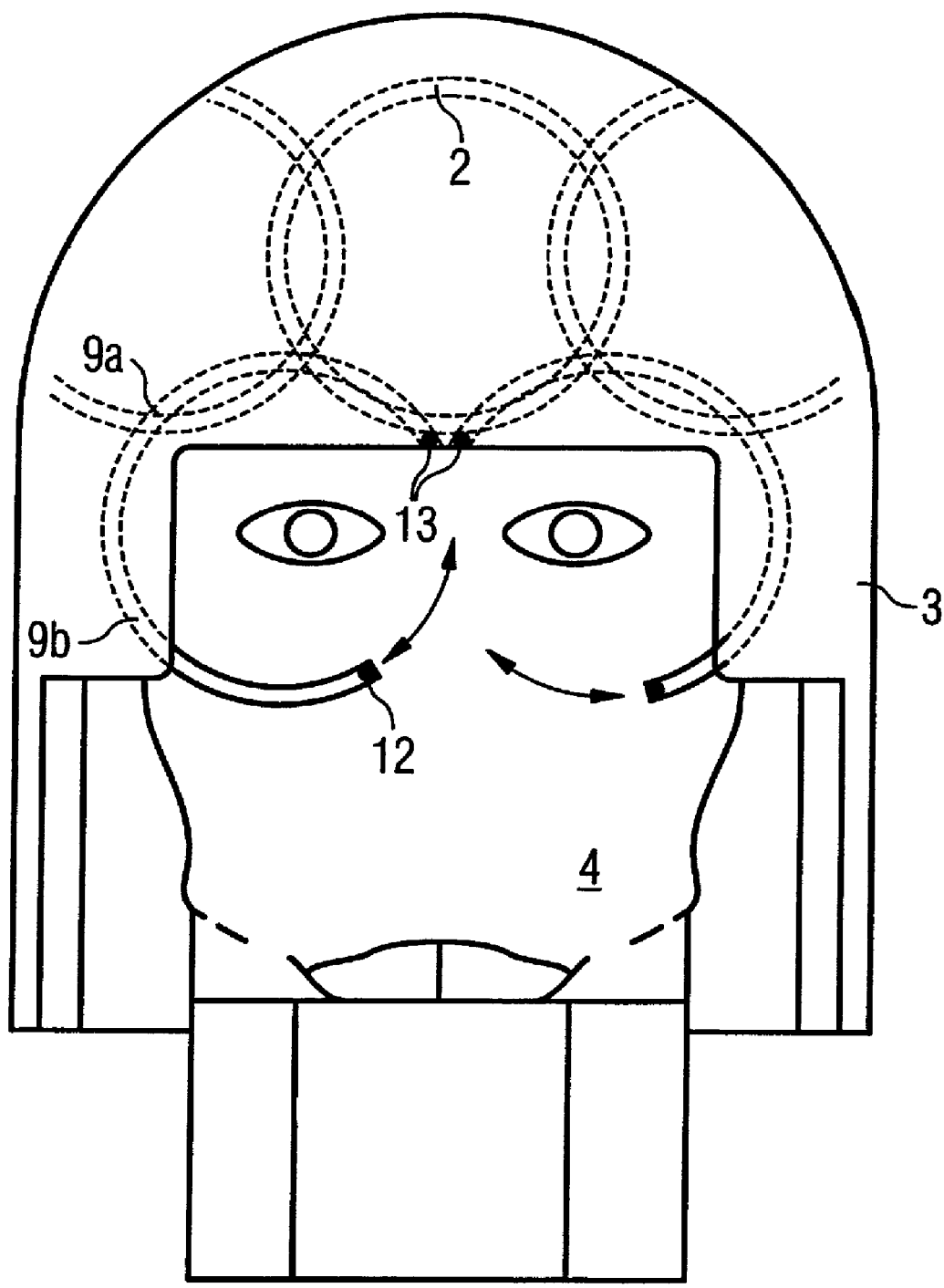
FIG. 3 is a front view of a second embodiment of the present invention.

FIG. 3 shows a second embodiment of the present invention. Here the antenna elements 2 are arranged on the coil housing 3 in the same manner as in the first embodiment, but the second antenna elements 9 exhibit a different design. They are formed as two circle segments of essentially equal length with the same radius that are situated atop one another and are borne such that the can be displaced against one another in a storage in the coil housing 3. The antenna element parts 9a, 9b are arranged atop one another and connected with one another electrically by slip contacts that are respectively arranged on a free end of one of the circle segments 9a, 9b. A plug connector 12 or a socket connector 13 as a mating plug 13 is respectively arranged at the respective other free end of the two circle segments. As shown in FIG. 3, in this way a circle segment 9b of the second antenna element part can be run out from its storage in the coil housing 3 around an eye of the patient 4 until its free end (which is provided with a connector 12) meets the mating plug 13 that can be plugged into the other free end of the circle segment-shaped first antenna element part 9a anchored in the coil housing 3. As can be recognized in FIG. 3, the coil housing approaches closer to the eyes of the patient 4 in the field of view of the patient relative to the embodiment shown in FIG. 1a in order to offer a larger storage area to the second, movable antenna element part, into which larger storage area said second antenna element part can be inserted in order to expose the field of view. Moreover, the guide of the circle segment-shaped antenna element part 9b is thereby lengthened and thus improved, and a more secure guidance of the slip contacts is ensured.

Figure 4:
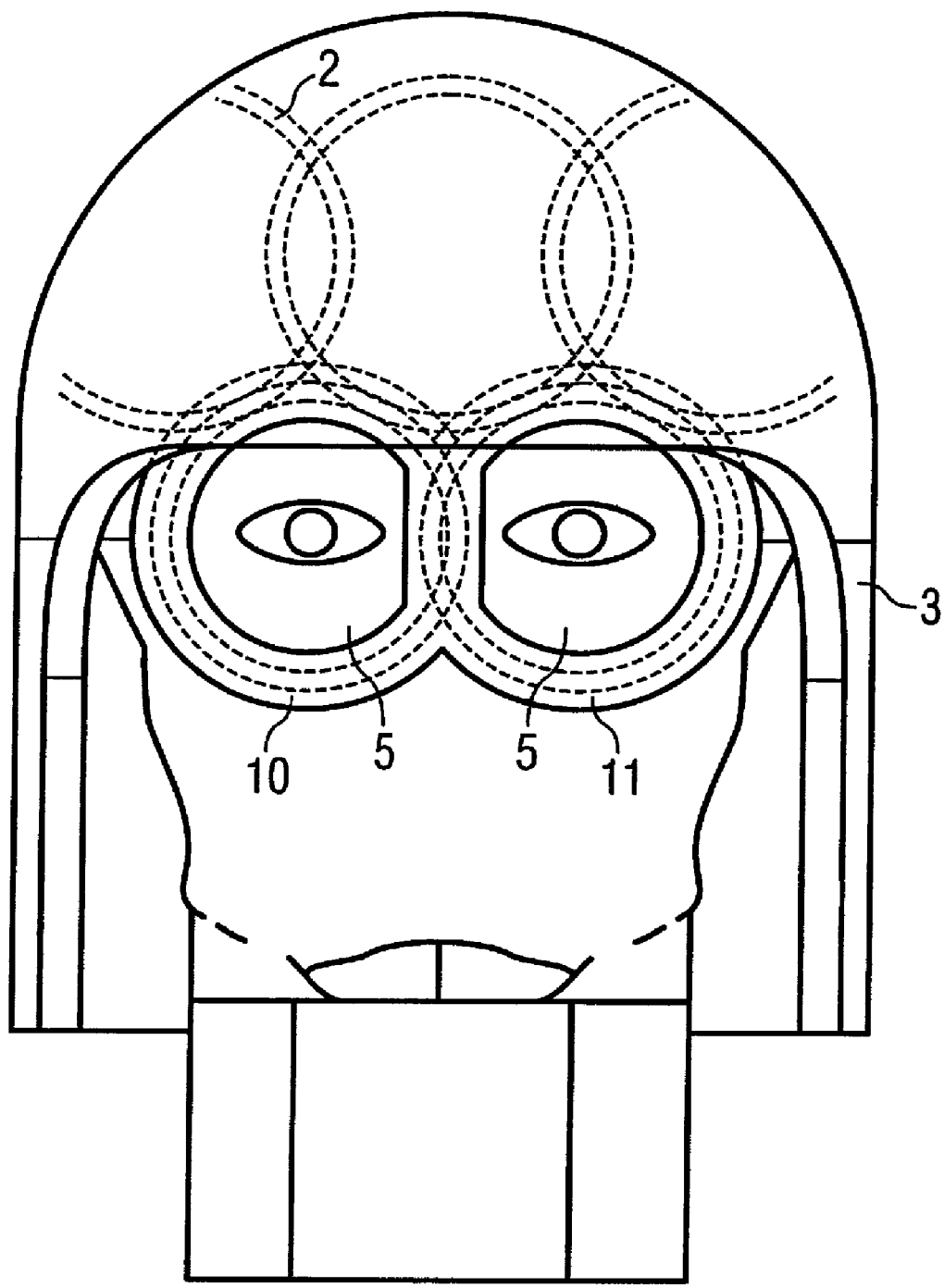
FIG. 4 shows a third embodiment of the present invention in plan view.
Figure 5A:
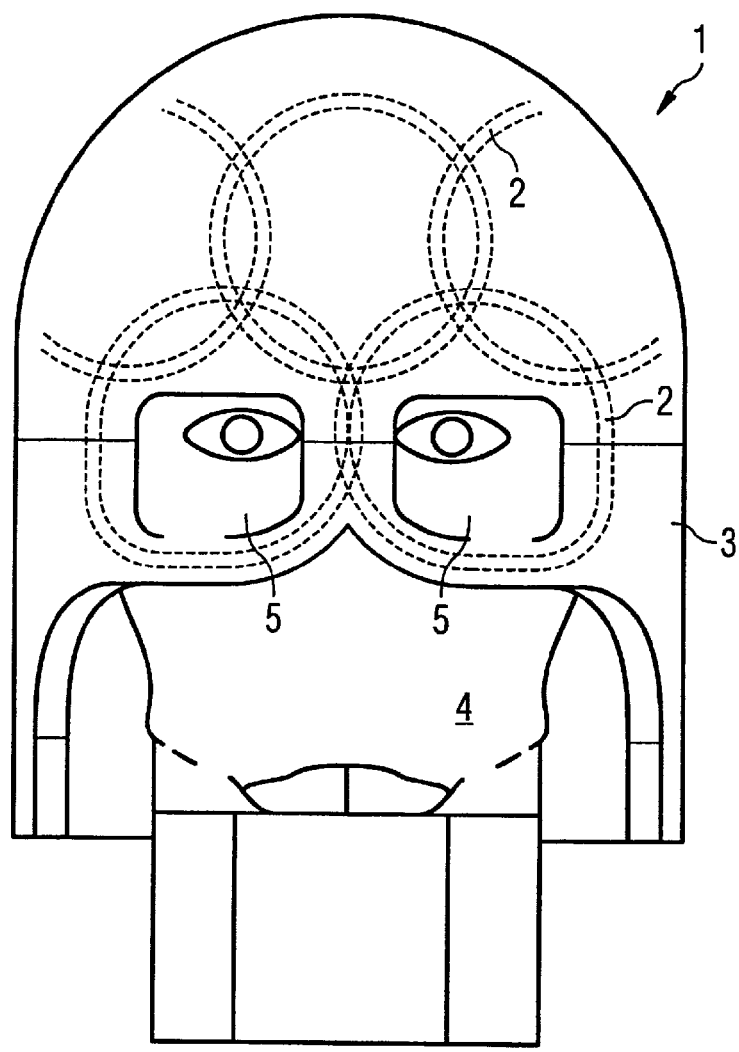
FIGS. 5a and 5b show a head coil according to the prior art in front view and in perspective view.
Figure 5B:
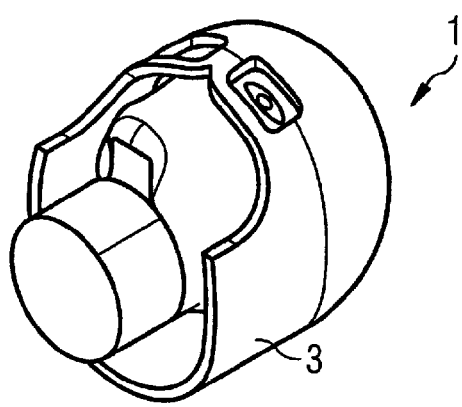

FIG. 4 shows a third embodiment of the present invention in which the second antenna elements 10 are executed completely separate and independent of the first antenna elements 2. Two second antenna elements on separate housing carriers 11 with gaps 5 can be recognized in FIG. 4. The second antenna elements partially overlap. In the shown exemplary embodiment the separate housing carrier has the shape of a pair of eyeglasses, such that the patient 4 can look out from the head coil through the openings 5. As is typical given eyeglasses, the housing carrier 11 can exhibit lateral eyeglass earpieces in order to hold the carrier housing behind the ears of the patient. The second antenna elements 10 are thus electrically as well as mechanically completely separate from the first antenna elements. The eyeglass-shaped second antenna elements can also be used as eye coils completely separate from the head coil 1, when desired.

The head coil according to the present invention can be optimized for imaging. No compromises in the antenna design must be made, thus no performance losses must be accepted in order to offer the patient a free field of view for the case of functional imaging (fMRI). For fMRI the patient is accessible from the outside without limitation via mirrors for animation, meaning that no information loss occurs due to sight-occluding housing parts. Due to the removable second antenna elements in the viewing region, the possibility is likewise offered to expose the patient to stimulation or the like via the now-free space in the head coil.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance head coil comprising:
   a helmet-shaped head coil housing comprising a frontal opening therein that, when said head coil housing is worn on the head of a patient, frees the patient's field of view;
   a plurality of magnetic resonance antenna elements mounted at said head coil housing, each of said magnetic resonance antenna elements being configured to at least receive magnetic resonance signals originating in the head of the patient;
   said plurality of antenna elements including two antenna elements each comprising a first antenna element part fixedly mounted to said head coil housing adjacent said frontal opening, and a second antenna element part mounted to said head coil housing for sliding movement relative to the first antenna element part, each of said first and second antenna element parts having an arcuate shape and each comprising a first free end and a second free end;
   for each of said two antenna elements, the second antenna element part thereof being slidably movable along an arcuate path from a standby position on or in said head coil housing to an operating position in said frontal opening that does not substantially obstruct the patient's field of view; and
   for each of said two antenna elements, the first and second antenna element parts thereof comprising a slip contact, at the respective first ends of said first and second antenna element parts, that makes an electrical connection between the first and second antenna element parts while allowing sliding movement therebetween, and a plug connection, at the respective second ends of said first and second antenna element parts, that forms a closed loop between said first antenna element part and said second antenna element part in said operating position.

2. A magnetic resonance head coil as claimed in claim 1 wherein, for each of said two antenna elements, the first antenna element part thereof comprises a first segment of a circle, and the second antenna element part thereof comprises a second segment of said circle, and wherein said second antenna element part slidably moves along a circular path from said standby position to said operating position.

3. A magnetic resonance head coil as claimed in claim 2 wherein said two antenna elements are positioned at said head coil housing to cause the respective circles, formed by the respective first and second antenna element parts thereof, to surround the respective eyes of the patient when the head coil holder is worn at the head of the patient.

* * * * *